United States Patent [19]

Mouissie

[11] Patent Number: 4,908,336
[45] Date of Patent: Mar. 13, 1990

[54] FLEXIBLE CIRCUIT AND CONNECTOR ASSEMBLY

[75] Inventor: Bob Mouissie, Berlicum, Netherlands

[73] Assignee: E. I. Du Pont de Nemours & Co., Wilmington, Del.

[21] Appl. No.: 330,874

[22] Filed: Mar. 30, 1989

[30] Foreign Application Priority Data

Mar. 31, 1988 [NL] Netherlands ............... 8800839

[51] Int. Cl.$^4$ ............................................. H01R 13/04
[52] U.S. Cl. ............................................. 439/496
[58] Field of Search ............................. 439/492–499

[56] References Cited

U.S. PATENT DOCUMENTS

| | | | |
|---|---|---|---|
| 3,065,445 | 11/1962 | Crimmins | 439/496 |
| 3,144,288 | 8/1964 | Grant | 439/496 |
| 3,887,255 | 6/1975 | Codrino | 439/496 |
| 3,893,745 | 7/1975 | Codrine | 339/244 |

FOREIGN PATENT DOCUMENTS 1962065 6/1971 Fed. Rep. of Germany.
1200801 8/1970 United Kingdom.

Primary Examiner—Joseph H. McGlynn

[57] ABSTRACT

A flexible circuit (1) provided with at least one connector for connecting an electrical component (25) to corresponding conductors of the flexible circuit. The connector consists of two parallel contact strips (5) from insulating flexible material, which are attached to the flexible circuit. The surfaces of the contact strips (5) facing each other have contact surfaces (6, 7) which are electrically connected to the corresponding conductors (3, 2) of the flexible circuit (1). The connector further consists of a positioning block (15) from insulating material, which is provided with holes into which the connecting pins (21, 22) of the electrical component (25) can be inserted. Grooves (16, 17) in which the contact strips lie are provided in the side faces, adjacent to the holes, of the positioning block and have a depth which is greater than the minimum distance between the wall of a hole and the adjacent side face of the positioning block. A clamping spring (37) which presses the contact strips (5) towards each other is provided.

9 Claims, 4 Drawing Sheets

FLEXIBLE CIRCUIT AND CONNECTOR ASSEMBLY

BACKGROUND OF THE INVENTION

The invention relates to a flexible circuit provided with at least one connector for connecting an electrical component to corresponding conductors of the flexible circuit.

The use of electronics in automobile technology is not limited solely to ignition control or fuel regulation and brake energization, but its potential use in the electrical switching of the gear box is also being realized.

It has been found that electronics makes the design more compact and more gear change functions can be carried out. For this purpose it is, however, important that the electrical control can be accommodated in this compact construction and is resistant to the large differences in temperature. The connection technique should also be resistant to these temperature variations and also to the fluids used in this connection.

In order to achieve a compact construction, use is made of a flexible circuit made of a base material which is resistant to these temperatures and fluids. If required, the flexible circuit may be of double-sided construction.

Provided on the base material or embedded therein are conductors produced by known etching techniques and in accordance with a layout which is determined by the control circuit.

In order, however, to achieve a connection to an electrical component, for example a control relay, electrical conductors and crimp connections are used which often give rise to faults and large contact resistances, particularly in the long term.

SUMMARY OF THE INVENTION

The object of the invention is to provide a flexible circuit of which type described above in which the problems are avoided.

In order to achieve this object, the present invention includes a connector formed by two contact strips made of flexible insulating material which are attached to the flexible circuit and which extend substantially parallel to each other and have, on the surfaces facing each other, contact surfaces which are electrically connected to the corresponding conductors of the flexible circuit. The connector further includes a positioning block which is made of insulating material and is provided with holes into which the connecting pins of the electrical component can be inserted, The present invention further includes grooves in which the contact strips lie are provided in the side faces, adjacent to the holes, of the positioning block. These grooves have a depth which is greater than the minimum distance between the wall of a hole and the adjacent side face of the positioning block. The present invention also has a clamping spring which presses the contact strips towards each other is provided.

The present invention achieves a very simple connection which requires little space. Moreover, this connection gives less rise to faults while ensuring a low contact resistance even in the long term. Moreover, the manufacture of the diverse components of the connector and also the provision thereof on the flexible circuit is much less labourintensive and therefore cheaper than the connections used hitherto.

The electrical connection between the contact surfaces of the contact strips and the corresponding conductors and the mechanical connection between the contact strips and the flexible circuit is preferably achieved in that the contact strips extend parallel to, and at a distance from, an edge of the flexible circuit and are connected thereto by a connecting strip on which connecting conductors are provided The connecting conductors are electrically connected, on the one hand, to the contact surfaces of the contact strips and, on the other hand, to the corresponding conductors of the flexible circuit.

The clamping spring is preferably composed of a strip which is in contact with, and extends in the same direction as, the connecting strip of the flexible circuit and of two resilient legs formed onto either side of the strip which extend transversely to the plane of the strip and in the direction of the grooves of the positioning block. As a result, the clamping spring is firmly in contact with the positioning block.

In an embodiment, the strip of the clamping spring is provided, at the end which is furthest from the flexible circuit, with a hook-shaped element which engages in a recess in the face of the positioning block which faces away from the flexible circuit. The clamping spring is fixed on the positioning block by the gripping action.

The fixing is improved still further in that the strip of the clamping spring is provided, at the end which is nearest to the flexible circuit, with a hole for receiving a projecting part of the positioning block.

In an embodiment, the spacing of the legs of the clamping spring at the free end in the disengaged state is less than the distance between the bottoms of the grooves of the positioning block.

In a further embodiment, the spacing of the legs of the clamping spring near the strip is greater than the distance between the bottoms of the grooves of the positioning block.

The special shaping of the legs of the spring clamp ensures a good contact pressure, while the clamping spring is easy to fit.

Preferably, the contact strips are provided at the free ends with transversely extending projecting parts which are received in corresponding recesses in the positioning block. A good fixing of the contact strips is achieved by the gripping action between the projecting parts and the recesses.

The contact pins of a component are better held in place in that the dimension of the positioning block is greater in the direction of the groove than the length of the groove.

BRIEF DESCRIPTION OF THE DRAWINGS

The invention will be explained in more detail below by reference to the drawings. In the drawings.

DETAILED DESCRIPTION OF THE INVENTION

Figure 1:
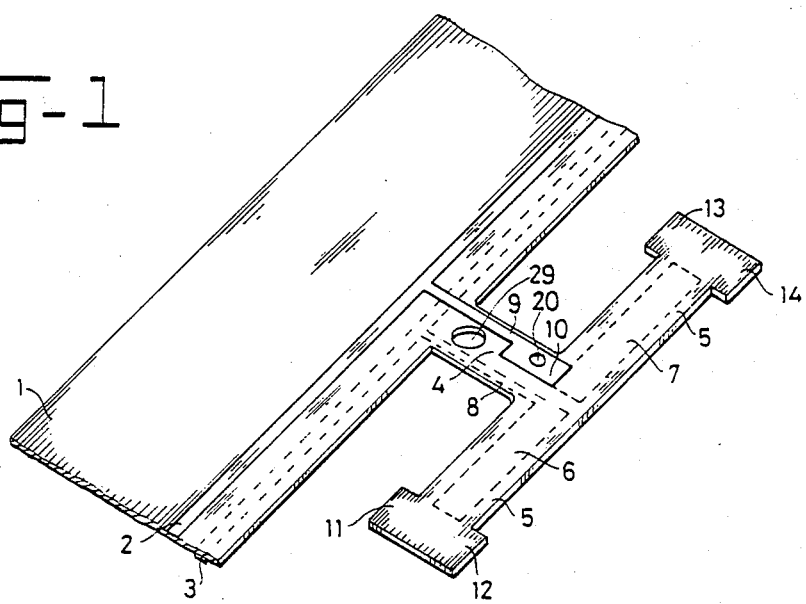
FIG. 1 shows an embodiment of the flexible circuit according to the invention.

The flexible circuit comprises a flexible sheet-like base element 1 made of electrically insulating material, as shown in FIG. 1. The material of and base element is resistant to the prevailing operating temperatures and the fluids used. Conductors 2 and 3 are provided on the base material or embedded therein by means of known etching techniques. Preferably, the flexible circuit is of double-sided construction. The pattern of the other conductors, which are not shown, of the flexible circuit matches the required interconnections of the components of the circuit, for example a control circuit for a gear box.

The flexible circuit is provided at the edge with at least one connector for connecting an electrical component, for example a control relay. The connector comprises two contact strips 5 which have contact surfaces 6 and 7 respectively which are electrically connected to the respective conductors 2 and 3. For these connections and the mechanical connection of the flexible circuit and contact strips, the connector is preferably provided with a connecting strip 4 which extends from the edge of the flexible circuit 1 virtually perpendicular thereto. Said strip is preferably composed of the same insulating base material as that of the flexible circuit. Two flexible contact strips 5 made of a flexible and electrically insulating material are formed onto the free end of said connecting strip 4. The contact strips 5 extending on either to the connecting strip 4 and extend parallel to the edge of the flexible circuit 1. The contact strips 5 are virtually perpendicular side of the connecting strip 4 are provided on the same side with contact surfaces 6 and 7 which are separated from each other but are connected to the conductors 2 and 3 respectively of the flexible circuit. The connection 8 between the contact surface 6 and the conductor 3 is on the same side as the contact surface 6 and the conductor 3. The connection between the connector 2 and the contact surface 7 comprises two parts 9 and 10, the part 9 being on the same side as the conductor 2, while the part 10 is on the same side as the contact surface 7. The connection between the two parts 9 and 10 is achieved by the plated-through hole 20. Projecting parts 13 to 14 inclusive are formed onto the free end of each contact strip 5.

Figure 3:
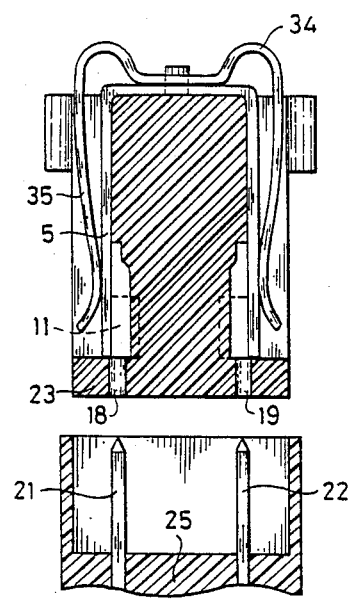
FIG. 3 shows a section through the assembled connector.
Figure 2A:
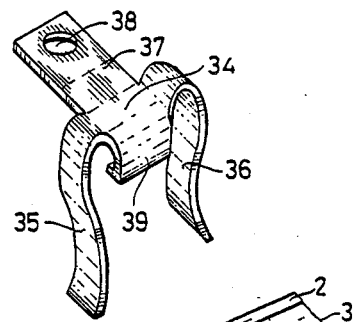
FIGS. 2a, b and c show components of the connector of the flexible circuit.
Figure 2B:
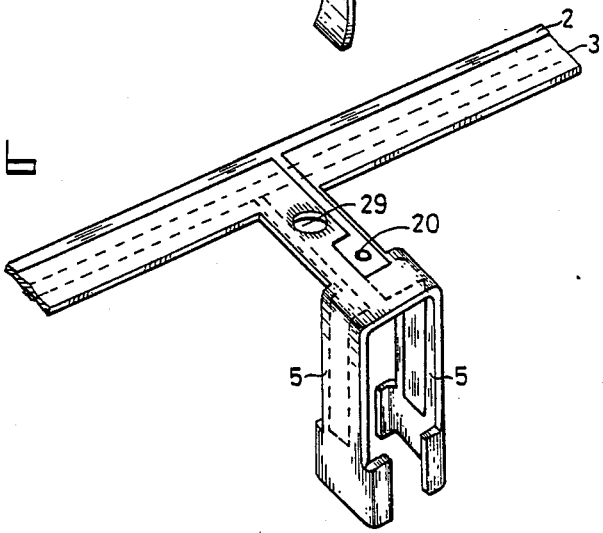
Figure 2C:
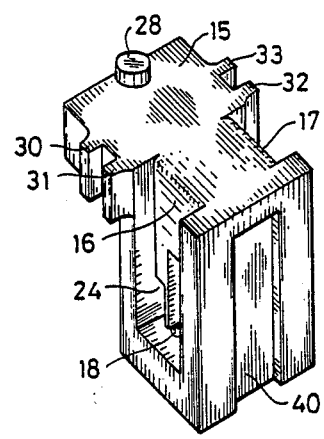

The free ends of the contact strips 5 are bent over a positioning block 15 until they lie in grooves 16 and 17. (See FIGS. 2a-2c) The positioning block is provided with holes 18 and 19 into which the connecting pins 21 and 22 of control relay 25 can be inserted. (See FIG. 3) The grooves have a depth which is greater than the minimum distance between the side face of the positioning block and the wall of a hole. As a result, an inserted connected pin 21, 22 will be exposed at the position of the associated groove 16 or 17 respectively and the contact surfaces 6 and 7 at the end of the contact strips 5 can come into contact with the connecting pins 21 or 22 respectively, associated therewith, of the control relay 25. The same applies to the other end of the strip 5 and the connecting pin 22. In this way a connection is made between the connecting pins 21 and 22 and the conductors 3 and 2 respectively of the flexible circuit 1. The grooves 16 and 17 preferably do not extend to the face 23 of the positioning block 15, with the result that the connecting pins are satisfactorily retained and fixed at the beginning of the holes. The protecting parts 11 to 14 inclusive are pressed, after bending over, into respective recesses, of which only the recess 24 can be seen in FIG. 2c. A spring clamp 34 which holds the strips 5 in place in the grooves and ensures good contact pressure of the contact surfaces 6 and 7 of the strips 5 against the contact pins 21 and 22 respectively associated therewith is pressed over the contact strips 5 bent over the positioning block 15. (FIG. 2a-2c) The holding of the ends of the strips 5 in place is further improved by the engagement of the projecting parts 11 to 14 inclusive in the recesses 24 associated therewith.

The positioning block 15 is provided with a short cylindrical pin 28 which fits into the hole 29 in the connecting strip 4. As a result, the flexible circuit and the positioning block 15 are additionally fixed with respect to each other.

The positioning block 15 is further also provided with projecting parts 30 to 33 inclusive between which two recesses are formed for fixing grooves for possibly fixing the positioning block on a guide bracket for the flexible foil.

The contact strips 5 are pressed towards each other by a clamping spring 34 in the grooves 16 and 17 of the positioning block. The clamping spring is composed of two resilient legs 35 and 36 which hold the contact strips 5 in place and press the contact surfaces thereof against the inserted connecting pins 21 and 22 of the control relay. The legs are bent in a manner such that the spacing of the free ends of the legs 35 and 36 in the disengaged state is less than the distance between the bottoms of the grooves 16 and 17, while the distance between the legs becomes larger starting from the free ends. As a result, the spring clamp can easily be fitted, while a good contact pressure is ensured.

The spring clamp 34 is provided with a strip 37 in which a hole 38 is provided for receiving the pin 28 of the positioning block 15. The spring clamp 34 is provided with a hook-shaped element 39 which engages in a recess 40 of the positioning block 15. It is evident that, as a result of the interaction between pin 28 and hole 38 and the snapping engagement of the hook 39 in the edge of the recess 40, an optimum fixing of the spring clamp is achieved resulting in an optimum holding in place of the contact strips 5 and the connecting strip 4 with respect to the positioning block.

Figure 4:
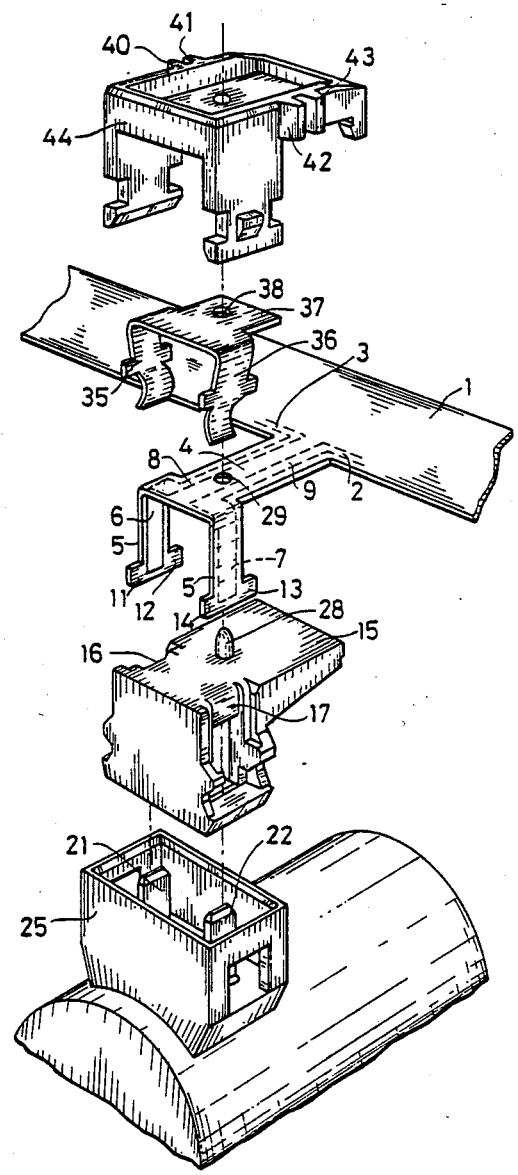
FIG. 4 shows another embodiment of the connector with the components disassembled.
Figure 5:
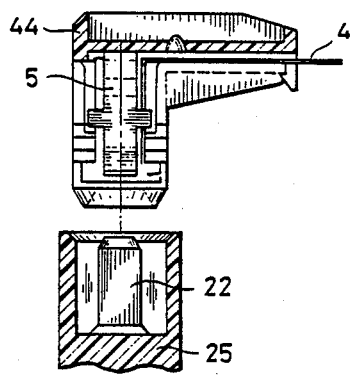
FIGS. 5 and 6 show sections through the embodiment of FIG. 4.
Figure 6:
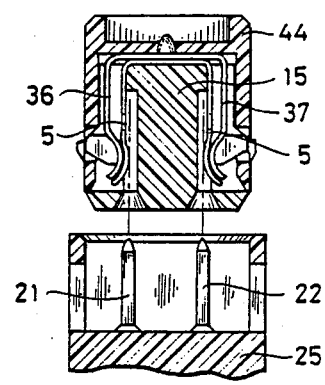
Figure 7:
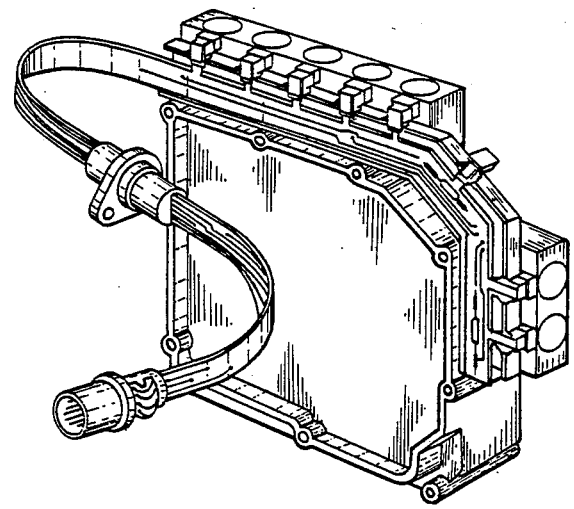
FIG. 7 shows a flexible circuit fitted on a gear box.

In the other embodiment according to FIGS. 4-6, the pin 28 is centered by means of a cover 44 which is pushed over the positioning block 15. This cover has projecting parts 40-43 for fixing to the guide bracket. FIG. 7 shows the flexible circuit fitted in a gear box.

I claim:

1. A flexible circuit assembly provided with at least one connector for connecting an electrical component to corresponding conductors of a flexible circuit comprising a connector having two contact strips formed on insulating flexible material which are attached to the flexible circuit and which extend essentially parallel to each other and have, on the surfaces facing each other, electrical contact surfaces which are electrically connected to the corresponding conductors of the flexible circuit, a positioning block which is made of insulating material and is provided with holes into which connecting pins of an electrical component can be inserted, said block including grooves in which the contact strips lie, said grooves being provided in the sides of the positioning block adjacent by said holes, said grooves having a depth which is greater than the minimum distance between the wall of a hole and the adjacent side of the positioning block, and a clamping spring which presses the contact strips towards each other.

2. A flexible circuit assembly according to claim 1, wherein the dimension of the positioning block is greater in the direction of the groove than the length of the groove.

3. A flexible circuit assembly according to claim 1, wherein the contact strips extend parallel to and at a distance from an edge of flexible circuit and are connected thereto by a connecting strip on which connecting conductors are provided which are electrically connected on one hand, to the contact surfaces of the contact strips and, on the other hand, to the corresponding conductors of the flexible circuit.

4. A flexible circuit assembly according to claim 3, wherein the contact strips are provided at the free ends with transversely extending projecting parts which are received in corresponding recesses in the positioning block.

5. A flexible circuit assembly according to claim 3, wherein the clamping spring comprises a spring strip which is in contact with and extends in the same direction as the connecting strip of the flexible circuit and two resilient legs formed onto either side of the spring strip which extend transversely to the plane of the spring strip and in the direction of the grooves of the positioning block.

6. A flexible circuit assembly according to claim 5, wherein the spring strip of the clamping spring is provided at the end furthest from the flexible circuit with a hook-shaped element which engages in a recess in the side of the positioning block which faces away from the flexible circuit.

7. A flexible circuit assembly according to claim 6, wherein the spring strip of the clamping spring is provided, at the end nearest to the flexible circuit with a hole for receiving a projecting part of the positioning block.

8. A flexible circuit according to claim 7, wherein the spacing of the legs of the clamping spring at the free end in the disengaged state is less than the distance between the bottoms of the grooves of the positioning block.

9. A flexible circuit assembly according to claim 8, wherein the spacing of the legs of the clamping spring near the spring strip is greater than the distance between the bottoms of the grooves of the positioning block.

* * * * *